United States Patent
Tsutsui

(10) Patent No.: US 6,911,831 B2
(45) Date of Patent: Jun. 28, 2005

(54) METHOD FOR AUTOMATICALLY CHANGING CURRENT RANGES

(75) Inventor: Junko Tsutsui, Kanagawa (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/736,198

(22) Filed: Dec. 15, 2003

(65) Prior Publication Data

US 2004/0135591 A1 Jul. 15, 2004

(30) Foreign Application Priority Data

Jan. 10, 2003 (JP) ........................................ 2003-003951

(51) Int. Cl.[7] .............................................. G01R 27/08
(52) U.S. Cl. .................. 324/713; 324/110; 324/765
(58) Field of Search ........................ 323/284; 324/110, 324/158.1, 713, 765; 327/68, 70; 361/70

(56) References Cited

U.S. PATENT DOCUMENTS

| | | | | |
|---|---|---|---|---|
| 3,648,175 A | * | 3/1972 | Barnard et al. | 324/115 |
| 3,875,506 A | * | 4/1975 | Cath et al. | 324/110 |
| 4,467,275 A | * | 8/1984 | Maeda et al. | 324/713 |
| 5,406,217 A | * | 4/1995 | Habu | 324/765 |
| 5,786,689 A | * | 7/1998 | Kimura | 324/158.1 |
| 6,069,484 A | * | 5/2000 | Sobolewski et al. | 324/765 |
| 6,127,836 A | * | 10/2000 | Jacobson et al. | 324/765 |
| 6,262,670 B1 | * | 7/2001 | Ballou | 340/664 |
| 6,489,797 B1 | * | 12/2002 | MacDonald et al. | 324/765 |
| 2003/0112028 A1 | * | 6/2003 | Kollmer et al. | 324/765 |

FOREIGN PATENT DOCUMENTS

| | | |
|---|---|---|
| JP | 58-148507 | 9/1983 |
| JP | 08-262069 | 10/1996 |

* cited by examiner

*Primary Examiner*—Anjan Deb
*Assistant Examiner*—Walter Benson

(57) ABSTRACT

In a method for fast, high-accuracy autoranging measurement, a current detection resistance is shared by a current measurement apparatus and a voltage source with current limiting function, a value of current output from the voltage source via the resistance being measured by the current measurement apparatus, and the current range of the current measurement apparatus and the compliance being automatically changed in accordance with the measured current value. The method includes a step of setting the compliance corresponding to the current output from the voltage source to a prescribed value (104), a step of measuring the value of the current output from the voltage source using the current measurement apparatus (106), a step of comparing the current measured by the trial measurement with the current range and judging whether or not the current range is optimum (108), and a step, in the case of a judgment that the current range is optimum, of outputting from the current measurement apparatus the value of current that was measured, and then increasing the current range and changing the compliance (112).

12 Claims, 15 Drawing Sheets

METHOD FOR AUTOMATICALLY CHANGING CURRENT RANGES

BACKGROUND OF THE INVENTION

1. Field of the Invention

The present invention relates to a method of measuring an output electric current of a voltage source unit (herein referred to as a source monitor unit or source measurement unit, and abbreviated as SMU) which includes an electric current measuring apparatus having a plurality of electric current ranges and an electric current controller by automatically selecting an appropriate electric current range, and more particularly to a method for changing the range while avoiding changes in the output voltage as much as possible and maintaining the speed and resolution of the measurement.

2. Related Art

In order to measure an electric current output from an SMU which is a voltage source having an electric current measurement unit or the like, autoranging has been proposed as a way of performing measurement and automatically selecting an appropriate current range. The SMU normally includes, in addition to the current measurement unit and voltage source, a current limit circuit which limits the output current so as not to exceed a limit value (hereinafter referred to as compliance), for the purpose of preventing destruction of the device under test (DUT) by excessive current. The current measurement unit and current control circuit require a resistance for the purpose of detecting the output current from the SMU, and this resistance is shared in the SMU for the benefit of cost and space reduction. Because this resistance is shared, the compliance is controlled by the current range. In the SMU, therefore, when the current range changes during autoranging measurement, an accompanying change of the compliance occurs. That is, at first the compliance is set by the user (hereinafter referred to as the true compliance), along with a correspondingly set current range. When the range setting is changed to a lower current range, and if the maximum current value measurable in the newly set current range (referred to as "upper limit value") is lower than the true compliance, as a matter of convenience, the compliance is set equal to the upper limit of that current range. If the current range is changed to a value that is greater than the true compliance, the compliance is set equal to the true compliance.

By the above-described linking of the current range with the compliance, a voltage that the user does not expect may be applied to the DUT in a limited member of occasions. The hardware configuration of a conventional SMU in which a resistance is shared as the current measurement resistance and the current control resistance is described below.

Although the SMU usually has a current control mode and a voltage control mode, to simplify the following discussions, the operation of each part of the SMU will be described herein for the case of voltage control.

FIG. 7 of the accompanying drawings is a block diagram showing the configuration of a conventional SMU. The SMU generally includes: a voltage digital-analog converter (hereinafter referred to as voltage DAC) 701 for performing digital-to-analog conversion of a voltage setting value; a current digital-analog converter (hereafter referred to as current DAC) 702 for performing digital-to-analog conversion of a current limit value (compliance); an inverter 705 that inverts the output of the current DAC 702 so as to limit the negative current; a voltage error amplifier 703; a power amplifier 708; current error amplifiers 704 and 706; a range resistance 709; a current monitor amplifier 710; a voltage monitor amplifier 713; and a measurement analog-digital converter 711 for obtaining a digitized measurement value from the obtained output current or voltage value.

The voltage error amplifier 703 usually controls the power amplifier 708. The voltage error amplifier 703 detects the amount of difference between the output voltage of the current DAC 701 and the output voltage fed back from a voltage follower 712 that functions to buffer the output voltage of the SMU, and controls the power amplifier 708 so that the set value of the voltage DAC 701 is the same as the output value of the SMU. The power amplifier 708 amplifies the voltage and current from the voltage error amplifier 703, and provides the output power of the SMU.

The current error amplifiers 704 and 706 are usually in the standby condition, and function to limit the current under prescribed conditions. The output current of the power amplifier 708 is converted to a voltage by the range resistance 709, and this voltage is normalized by the current monitor amplifier 710. The output current therefrom is input to an analog-digital converter (hereinafter referred to as an ADC) 711 and digitized, so as to obtain an output current value corresponding to the output voltage of the SMU.

The voltage output from the current monitor amplifier 710 is fed back to the current error amplifiers 704 and 706. The current error amplifiers 704 and 706 the respective perform control of the power amplifier 708 for each polarity, so that the current value does not exceed current value set at the DAC 702.

During voltage output, the voltage error amplifier 703 usually controls the power amplifier 708. If, for example, a sudden change occurs in the characteristics of the DUT, and the output value of the current monitor amplifier 710 exceeds the compliance set at the current DAC 702, the current error amplifier 704 or 706 controls the power amplifier 708 in place of the current error amplifier 703. With this, the voltage is controlled so that a current limited by the compliance set at the current DAC 702 is output. This condition is also referred to as the current loop condition. Under this condition, a signal indicating the current loop condition (the I−Loop status or I+Loop status) is sent to the controller from each of the current error amplifiers 704 and 706.

The range resistance 709 is implemented by a plurality of resistances corresponding to a plurality of current ranges. The lower the current range, the larger the range resistance 709 is. These range resistances are switched in accordance with a range to be set based on a command from the controller (not shown in the drawing) using a switch. The range resistance 709 functions for both current measurement and current limitation. This is because the resistance is expensive due to the influence that the accuracy of the current range resistance has on current measurement accuracy and also because the number of elements or parts should be reduce for lower costs and space savings. Because the range resistance is shared between current measurement and current limitation, it is not possible for the compliance to exceed the upper limit value of the selected current range.

The optimum current range for high-resolution measurement is described below. First, we will discuss current ranges that can be measured. Because the full scale of input to the ADC 711 is constant, once the current range is established, it is not possible to measure a current that exceeds the current range. It is therefore necessary to make the current range larger than the current to be measured.

Because the measurement resolution, on the other hand, is determined according to resolution relative to the full scale of input to the ADC 711, the smaller the current range, the higher the resolution is. To measure with high resolution, therefore, it is preferable to measure with the current range that is greater than the current value to be measured and, at the same time, lowest.

The above describes conventional SMU hardware configuration and the conditions required for high resolution measurement. Next, we will consider a control method for autoranging measurement with high resolution.

Autoranging measurement refers to measurement during which automatic selection is made of the optimum range for each measurement point while achieving good resolution. FIG. 8 of the accompanying drawings is a flowchart of conventional autoranging measurement. First, at step 800, the measurement starts. At step 802, the compliance is set to be the true compliance, and the current range is set to be a range that makes it possible to set the true compliance. At step 804, an autoranging spot measurement is carried out, and the current range and the compliance are changed as necessary. At step 808, it is determined whether or not the condition at that time satisfies the end condition set by the user. The end condition can be, for example, the number of measurements, the measurement time, or the final sweep value of the set voltage. The autoranging spot measurement (referred to as "spot measurement") is repeated at steps 804 and 808 until the end condition is met. The term "spot measurement" as used herein refers to a measurement made by automatically setting the optimum current range and the output of the resulting measured value. Spot measurement is described later herein in detail.

When the current range is changed, a change in the compliance accompanies linked to the current range because of reasons attributed to the above-described hardware configuration, and the change is set at the current DAC 702. The settings of the current range and the compliance after the change at step 804 are held until the next spot measurement. This is because it is common for two consecutive measurements to be mutually close or at least close enough to be of the same order, so that it is often possible to perform the consecutive measurements using the same current range. With this, it is possible to shorten the time spent performing range switching.

FIG. 9 of the accompanying drawings shows a flowchart illustrating step 804 in FIG. 8. First, after setting the SMU output voltage to the user-specified setting at step 904, at step 906 the current is provisionally measured. At this point, the compliance remains the same as the value previously set before step 900. At step 908, it is determined whether or not the current used in the range provisional measurement set at step 906 is the optimum current range. If the current range of the provisional measurement is not optimum, the range and compliance are changed at step 910, and the process is returned to step 906, at which a provisional measurement is again performed. The provisional measurement at step 906 and the changing of the compliance and current range at step 910 are repeated until the current range reaches the optimum range. When it is found that the optimum current range has been reached, the process proceeds to step 912, at which the measured value is output as a the result of the measurement. The spot measurement then ends at step 914.

With regard to the range change performed at step 910, as will be described below, the compliance also changes when the current range is changed, and if the upper limit of the current range is smaller than the true compliance, the compliance is equal to the value of the current range upper limit.

FIG. 10 of the accompanying drawings is a flowchart showing the conventional current range switching as in the above-noted step 910. At step 1002, it is determined whether or not the current range is appropriate, based on the current range, the measured value, and the current loop condition signal from the hardware. At this point, if the current range is found too large compared with the measured value and if the measurement can be made with a lower range, the current range is lowered at step 1006, and there is an accompanying change of the compliance to the upper limit value of the current range. On the other hand, if the current loop condition signal is detected from the hardware, that is, if the current range is excessively low, the current range is raised at step 1004, and there is an accompanying change of the compliance to the upper limit value of the current range or to the true compliance, whichever is lower.

If the current range is changed and lowered, the compliance is not the true compliance, but the upper limit value of the current range after the change. At this point, if the current flowing in the DUT increases and exceeds the compliance, the hardware controls the output voltage of the SMU so that the current flow does not exceed the compliance. Therefore, the output voltage of the SMU may actually be different from the expected voltage value.

The above-noted operation is schematically illustrated in FIG. 11 of the accompanying drawings. The SMU 1103 outputs a constant voltage to the DUT 1102 and performs autoranging current measurement. In this case, the direction of flow of current from the SMU 1103 into the DUT 1102 shall be taken as being positive. The other terminal of the DUT 1102 is grounded. The output voltage in this case, as shown by line 1116, takes a step-like waveform.

First, as shown by the open square symbol at point 1104, the compliance immediately after the start of the measurement is equal to the true compliance, and the current range is a range with which it is possible to measure a current corresponding to the true compliance. When the measurement starts, as shown by the arrows 1105, the current range is changed to the optimum range, and accompanying the range change the compliance is also changed. When the output voltage from the SMU 1103 increases, the current flowing into the DUT 1102 also increases. As shown by symbol ▼ at point 1106, when the increase in the output voltage from the SMU 1103 causes the current flowing in the DUT 1102 to attempt to exceed the compliance, the SMU 1103, as shown by line 1107, stops the increase of the output voltage, so that the current does not exceed the compliance, and outputs the current loop condition signal. When the controller detects this current loop condition signal, it increases the current range and the compliance, as indicated by symbol ▲ and symbol □ at point 1108. As indicated by symbol ◊ at point 1109, the current limit of the SMU 1103 is released, and the output voltage returns to its original condition. During this process, by such voltage variations as the one illustrated by line 1107, an unexpected voltage is applied across the terminals of the DUT 1102. (For the purpose of comparison, see the expected output voltage indicated by line 1120 in FIG. 11.)

Two patent documents JP 58-148507A (Pages 3 and 4, and FIG. 7) and JP 08-262069A (Pages 6 and 7 and FIGS. 1 and 2) disclose an SMU which prevents an unexpected current from being caused to flow when the range is switched as in the SMU. More specifically, reference 1 (JP 58-148507A) discloses the stopping of the output from a controlling amplifier when a variable impedance means is changing. Patent reference 2 (JP 08-262069A) discloses a conventional SMU that is provided with an additional output-voltage hold loop.

In very low current ranges, in order to improve the stability of measurement accuracy, a certain length of integrating time is usually required. For this reason, there exists an autoranging method in which excessive range lowering is avoided. With such method, the current range is not set lower than a user-specified minimum range or a limit range, even if the current range required for measurement is found to be low. By doing this, it is possible to reduce the measurement time, while maintaining the resolution required by the user. FIG. 12 is a flowchart showing another method of changing current ranges in such limit autoranging measurement as an alternative to the one shown in FIG. 10. First, at step 1202, it is determined whether or not the current range is large in comparison with the measured value. Next, at step 1204 it is determined whether or not the current range at that time is larger than the user-specified limit range. Only if the current range is larger than the limit range, the current range is reduced at step 1206, and the compliance is changed to the upper limit value of that current range. FIG. 13 shows the operation of the SMU at the time when the range is changed in this case. Similar to arrows 1105 in FIG. 11, changes are made of the range and the compliance as indicated by line 1301 in FIG. 13. Compared to the case indicated by arrows 1105 in the above-noted FIG. 11, however, as shown by symbol □ at point 1302 the compliance does not fall below the user-specified limit range (in this case 1.00E-4 A).

However, in the above-noted case, it is difficult to maintain the optimum range at all times. Additionally, because there is no change to a range lower than the user-specified limit range, the dynamic range of the measurement is reduced. Therefore, if a range that is lower than the limit range is the optimum range, the resolution of measurements of minute currents is compromised. For example, in comparison with FIG. 11, in the case of FIG. 13, in a measurement as shown by symbol ▲ at point 1302, because the current range does not fall below the limit range, the resolution indicated by symbol ○ shown at point 1303 in FIG. 13 is worse than that indicated by symbol ○ at point 1110 in FIG. 11.

Given the above, another method is proposed for the purpose of preventing the problems accompanying the limitation of the current range imposed by the compliance after the SMU output is set. In performing each autoranging spot measurement, the compliance is returned to the true compliance when the SMU output is set. In other words, the current range is returned to the value in effect immediately after the start. FIG. 14 shows the operation of this method in contrast to that of FIG. 9. First, at step 1400, similar to step 904 in FIG. 9, the current range and compliance set prior to step 1400 are used. At step 1402, the compliance is set to be the true compliance and the current range is set accordingly. At step 1404, the output of the SMU is changed. Therefore, because the provisional measurement at step 1406 does not touch upon the compliance, it is possible to prevent the output voltage of the SMU from changing. An example of this is shown in FIG. 15. As indicated by symbol ▲ at point 1502, the current range is set at the optimum range for the measurement. As indicated by symbol □ at point 1503, when the next spot measurement is started, the compliance is returned to the true compliance. The current range at that time is the value immediately after the start of the measurement, as indicated by symbol ▲ at point 1501. As indicated by symbol ▲ at point 1504, the current range is changed to the optimum range, and the measurement result is output. Therefore, the current range is not limited by the compliance and, as indicated by line 1505 in FIG. 15, the output voltage from the SMU does not exhibit unexpected variations.

According to the judgment made at step 1408 of FIG. 14, however, the current range may often not be optimum. For the reason, the probability may increase that the range is changed at step 1410. Additionally, because initial value of the current range is suitable for the true compliance, the number of range changes executed before reaching the optimum range increases. As a result, the measurement time becomes long. For example, in each of the spot measurements performed at symbols ● at points 1522, 1524, 1525, 1526, and 1527, a range change is executed, with an attendant increase in the length of measurement time required. Additionally, although not shown in FIG. 15, when the number of provisional measurements increases, the range changes from the true compliance to the optimum range take also more time.

SUMMARY OF THE INVENTION

Given the above situation, demand exists for a method of performing high-accuracy, high-speed measurement of voltage-current characteristics using current autoranging, while suppressing unexpected output when the voltage and current settings are changed.

Accordingly, the present invention provides a method for performing high-accuracy, high-speed measurement of voltage-current characteristics using autoranging function.

Specifically, one aspect of the present invention is a method for measurement in which a resistance for current detection is shared by a current measurement device and a voltage source having current limiting function or compliance function, the value of current output from the voltage source is measured by the current measurement device using the resistance, and a compliance and the current range of the current measurement device are automatically changed in accordance with the measured current value, wherein the method comprising the steps of:

setting the current range and a true compliance to user-specified values, setting the compliance for the current output from the voltage source to a prescribed value, measuring the value of current output from the voltage source using the current measurement apparatus, comparing the measured value of the current with the current range and determining whether or not the current range is optimum, if the current range is found not to be optimum, changing the current range and performing another measurement of the current output from the voltage source with the newly changed current range, with the compliance being at a value not exceeding the user-specified value and at the upper limit value of the newly changed current range, and if the current range is found optimum, having the current measurement apparatus output the resulting current measurement value, then raising the current range and making a corresponding change in the compliance.

In another preferred aspect of the present invention, if the current range is found to be optimum, the compliance is changed to either the user-specified value or the upper limit value of the raised current range, whichever is lower.

Another preferred aspect of the present invention includes, after the step of performing another measurement, if the current range is found not to be optimum, raising the current range and changing the compliance accordingly.

In yet another preferred aspect of the present invention, the lower limit of the current range is set beforehand with respect to the minimum output current value from the voltage source.

In another preferred aspect of the present invention, the step of determining whether or not the current range is optimum includes a step of calculating the ratio between the measured value of current output from the voltage source and the current range, and a step of determining whether or not the current range needs to be changed by comparing the calculated ratio with a prescribed ratio.

In another preferred aspect of the present invention, the step of determining whether or not the current range needs to be changed by comparing the calculated ratio with a prescribed ratio includes the calculation of the ratio between the measured value of current output from the voltage source and a current range that is lower than the presently set current range, and comparing this calculated ratio with a prescribed ratio.

In yet another preferred aspect of the present invention, the step of determining whether or not the current range needs to be changed sets the upper limit value of the maintained or changed current range as the true compliance.

In the foregoing aspects of the present invention, the compliance or the prescribed value or variation range of the current range can be set either by a user or by the measurement apparatus. The change of current ranges accompanying a variation in the output of the SMU can include up-ranging (raising of the current range) or down-ranging (lowering of the current range). Additionally, the timing of the changing of the current range can be established either immediately after the output of the measurement result or simultaneously with the SMU output setting or both. It is preferable that the determination of whether or not there is a need to change the current range be performed based on the whether, giving sufficient consideration to the resolution of the current range, the measurement of the current using this particular current range can be performed with sufficient accuracy (that is, whether the present current range is optimum). If the current can be measured with sufficient accuracy using a particular current range, the current range can be considered optimum or vice versa.

The above and other objects and features of the present invention will be more specifically described in the following detailed description, taken with the accompanying drawings.

BRIEF DESCRIPTIONS OF THE DRAWINGS

DETAILED DESCRIPTION OF THE PREFERRED EMBODIMENTS

Embodiments of the present invention are described below in detail, with reference to relevant accompanying drawings. The first embodiment of the present invention is described below with reference to FIG. 1 and FIG. 4.

Figure 1:
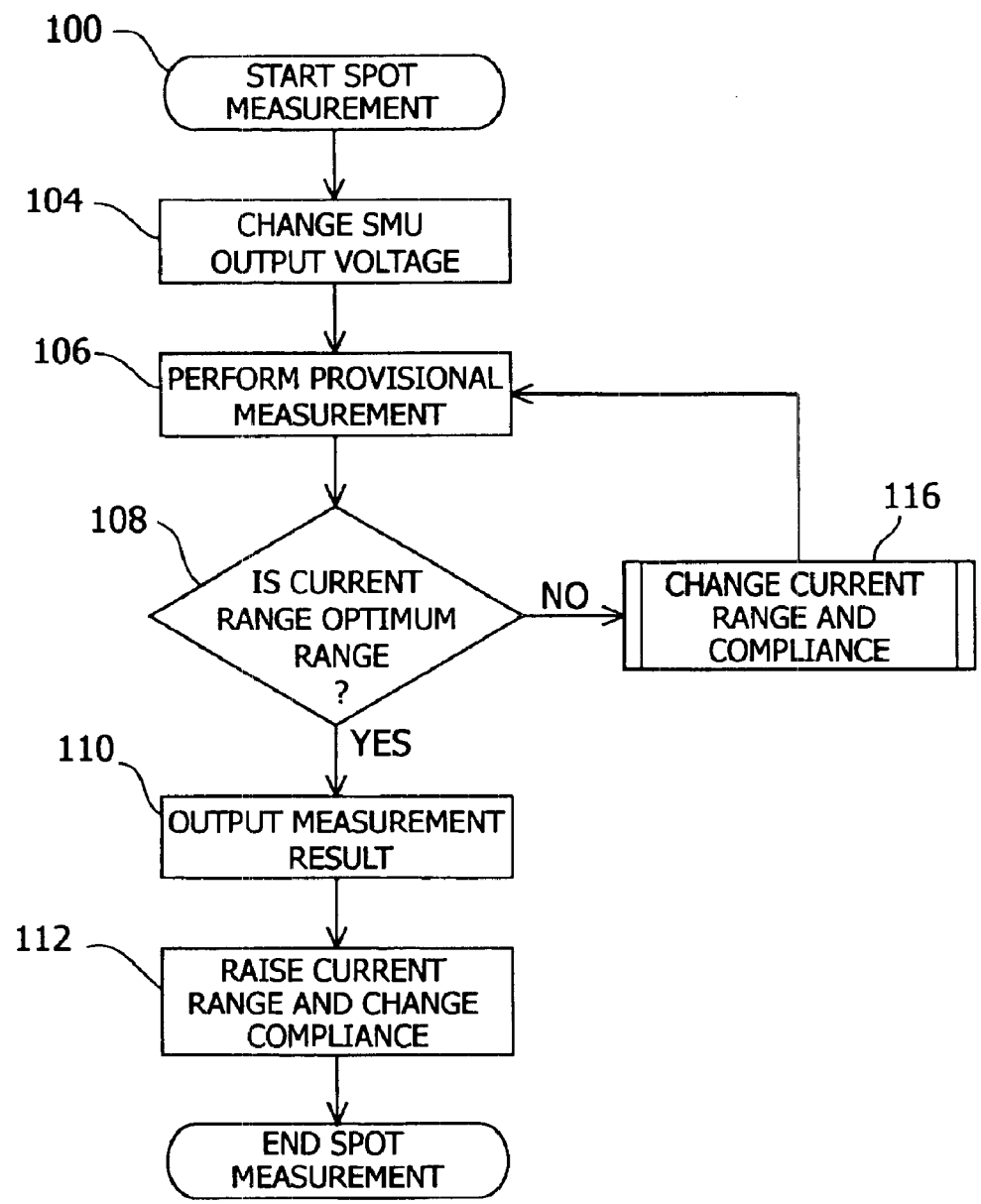
FIG. 1 is a flowchart showing the change of the current range according to a first embodiment of the present invention.
Figure 4:
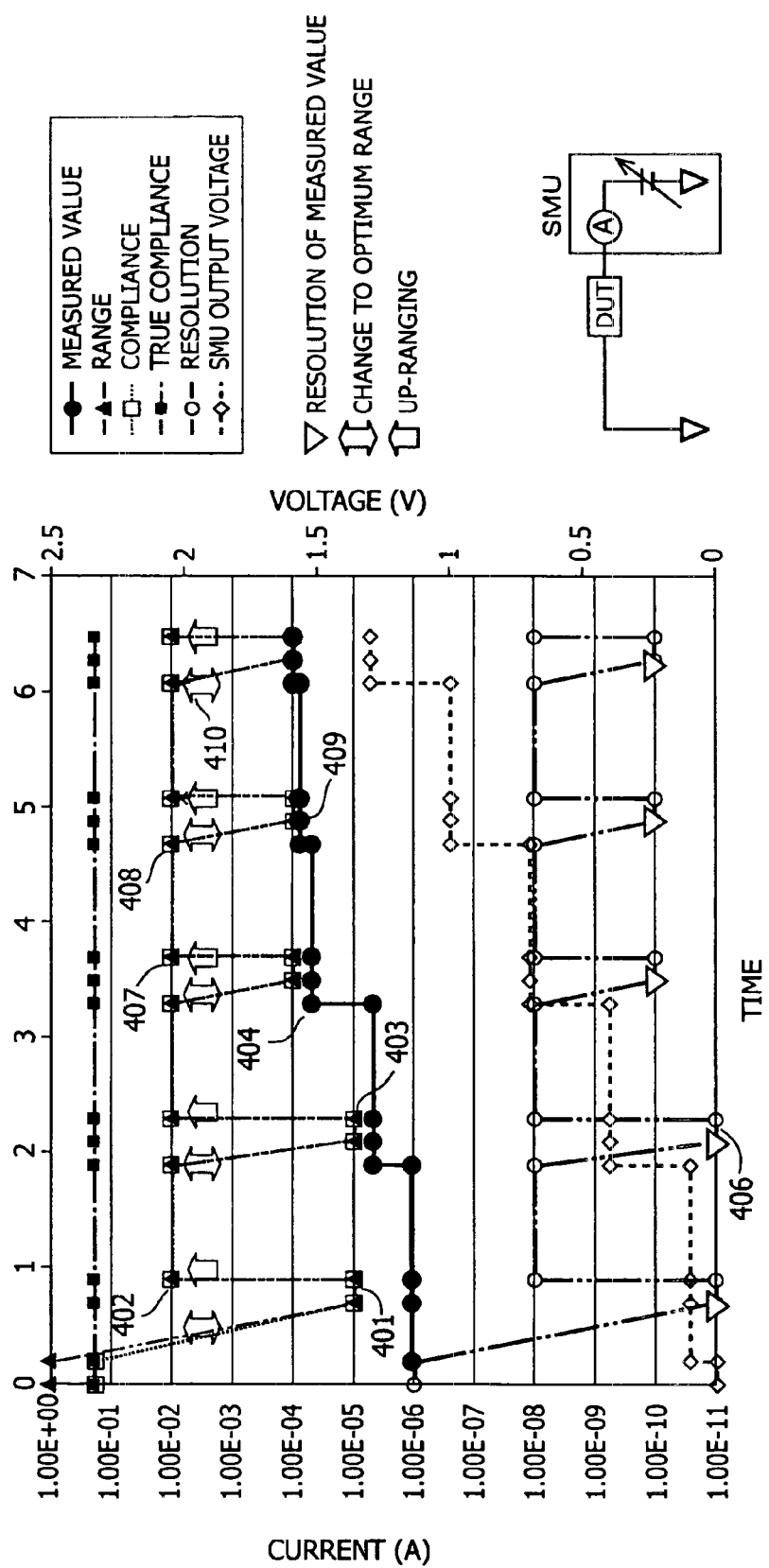
FIG. 4 is a graph showing the SMU operation in the first embodiment of the present invention.
Figure 8:
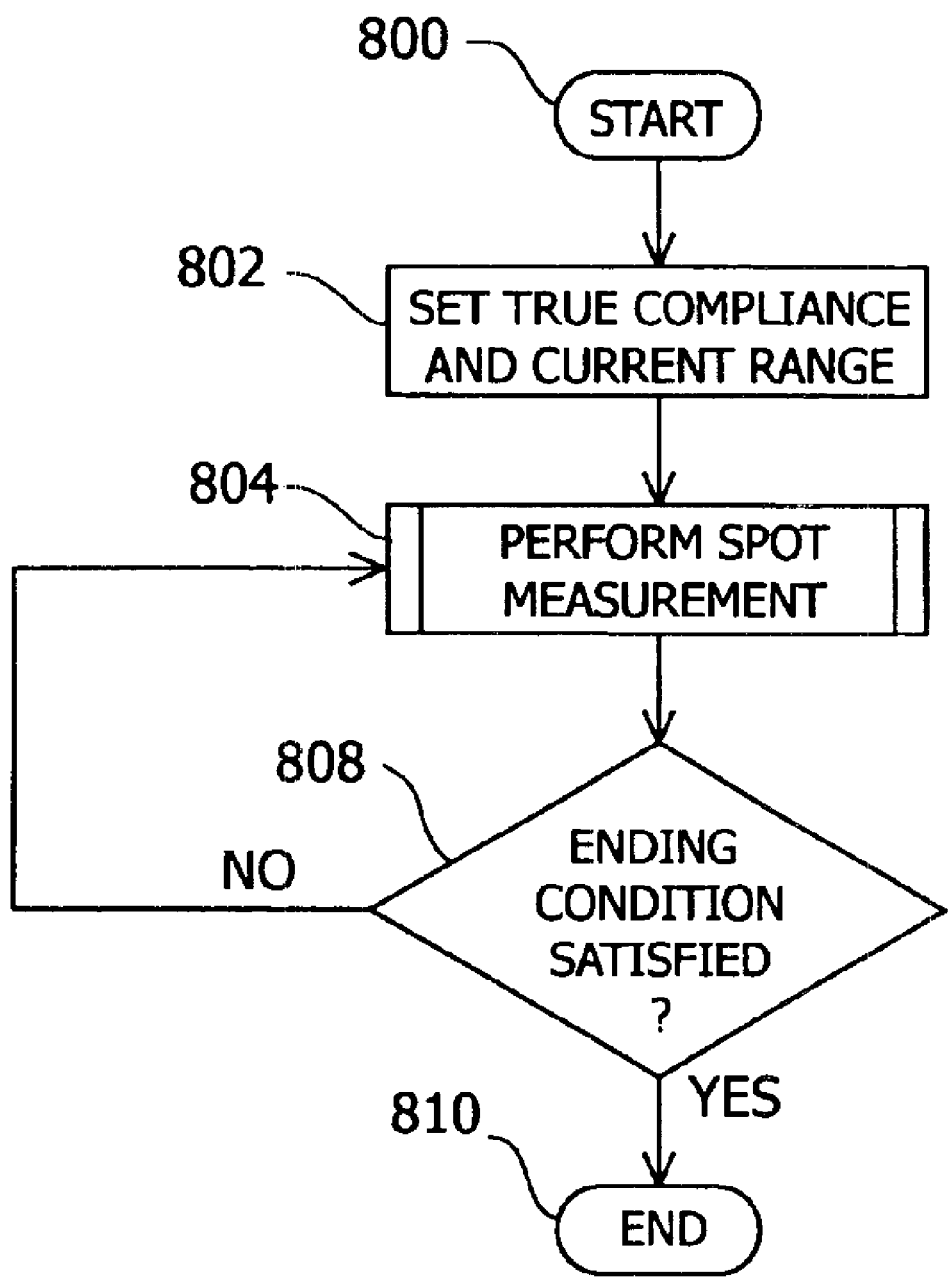
FIG. 8 is flowchart showing the measurement method of the past.
Figure 9:
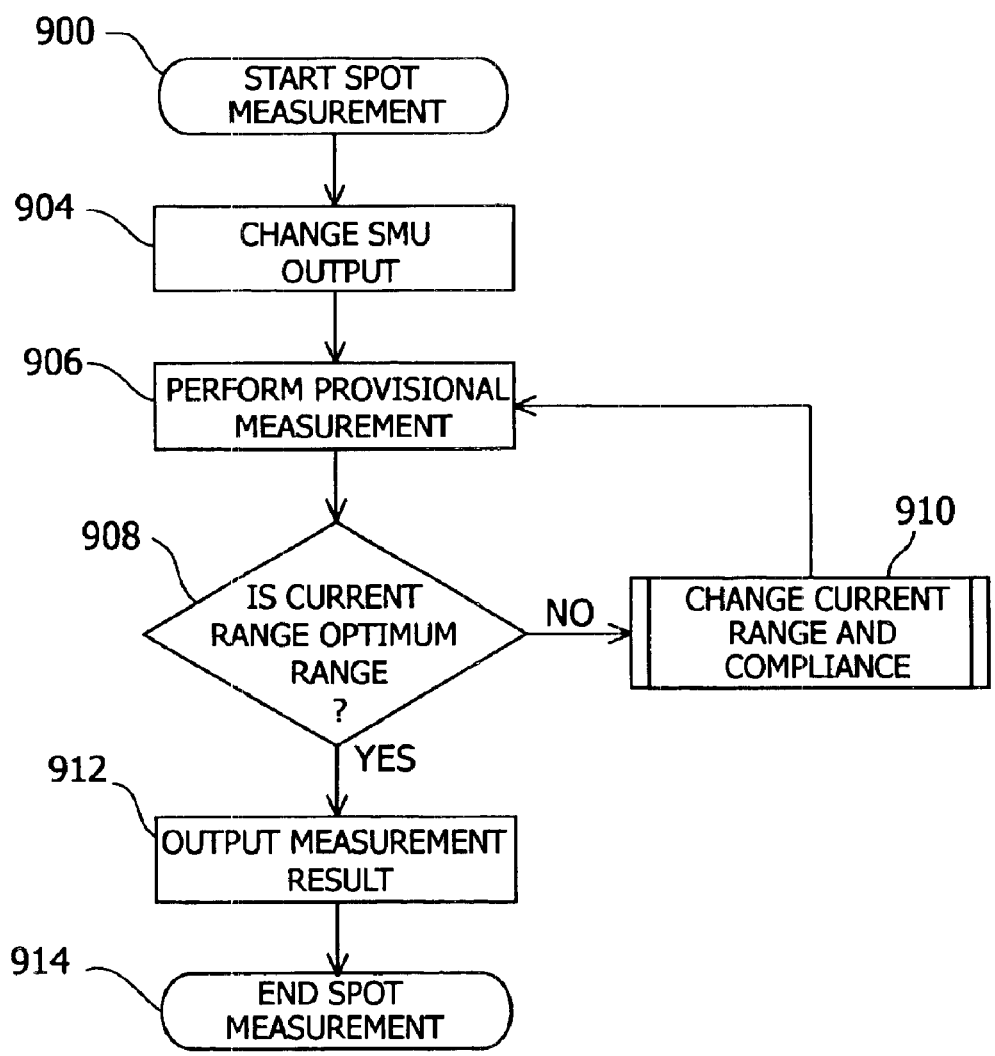
FIG. 9 is a flowchart showing a spot measurement method of the past.
Figure 11:
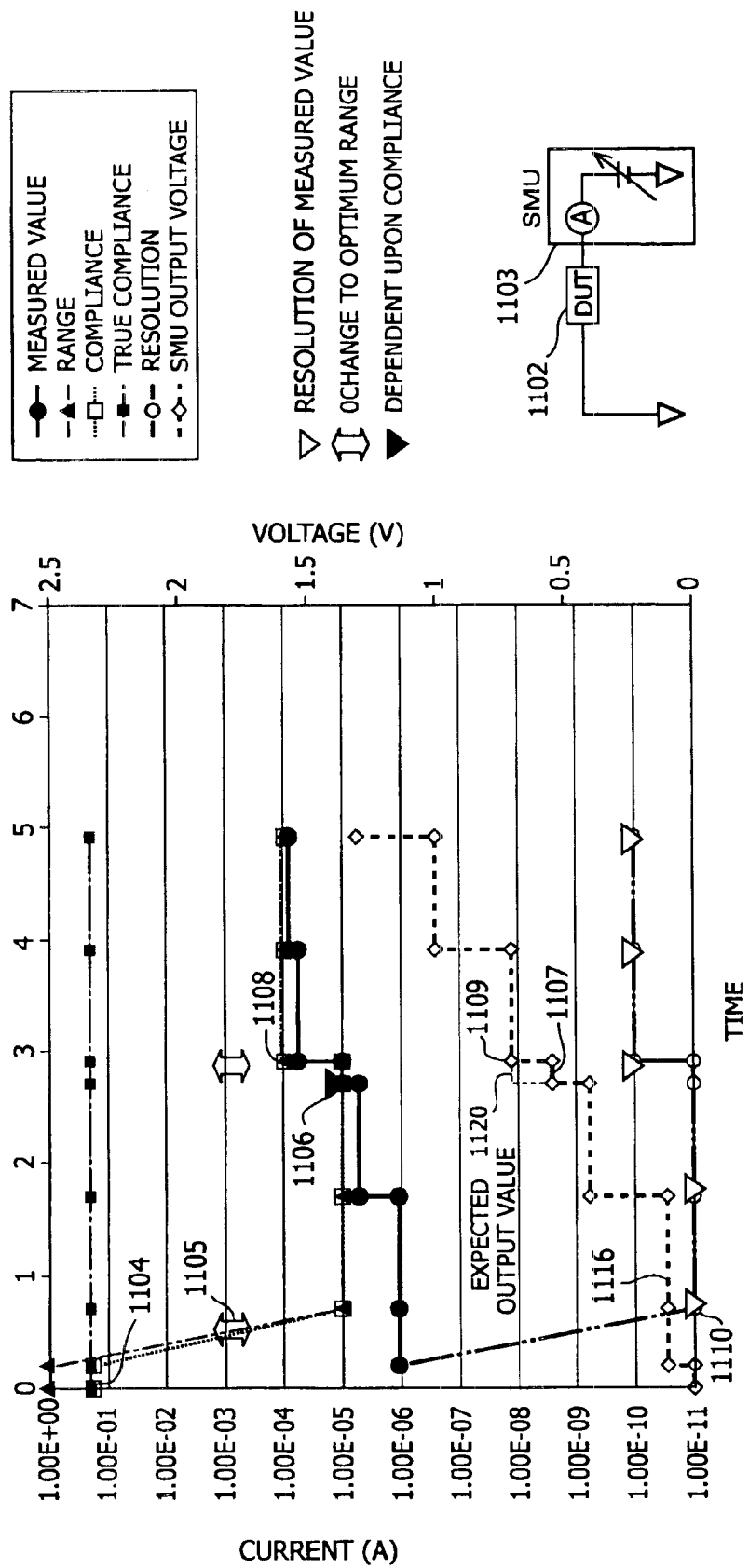
FIG. 11 is graph showing the change of the current range in autoranging of the past.

FIG. 1 is a flowchart showing a spot measurement applied to step 804 in FIG. 8, and FIG. 4 is a graph showing the SMU according to in the first embodiment of the present invention. As shown in the lower right part of FIG. 4, the circuit diagram is the same as the one shown in FIG. 11.

Turning first to the flowchart of FIG. 1, at step 100 the spot measurement starts. At step 104, the output voltage of the SMU is changed so as to change the voltage applied to the DUT. Next, at step 106, a provisional measurement is performed with the changed SMU output voltage. At step 108 a determination is made from the measured value obtained as to whether or not the current range used in the measurement has been an optimum range. If the current range is optimum, the process proceeds to step 110, and the measurement result is output. At step 112, the current range is raised with a prescribed width of variation (up-ranging) to accommodate a rise in the SMU output voltage, and either the upper limit value of the raised current range or the true compliance, whichever is lower, is set as the compliance. By doing this, the time required to change the current range can be shortened, compared with conventional methods. By setting the up-ranged current range as the compliance in this manner, it is possible to reduce the possibility that the voltage applied to the DUT from the SMU varies because of the compliance.

Figure 10:
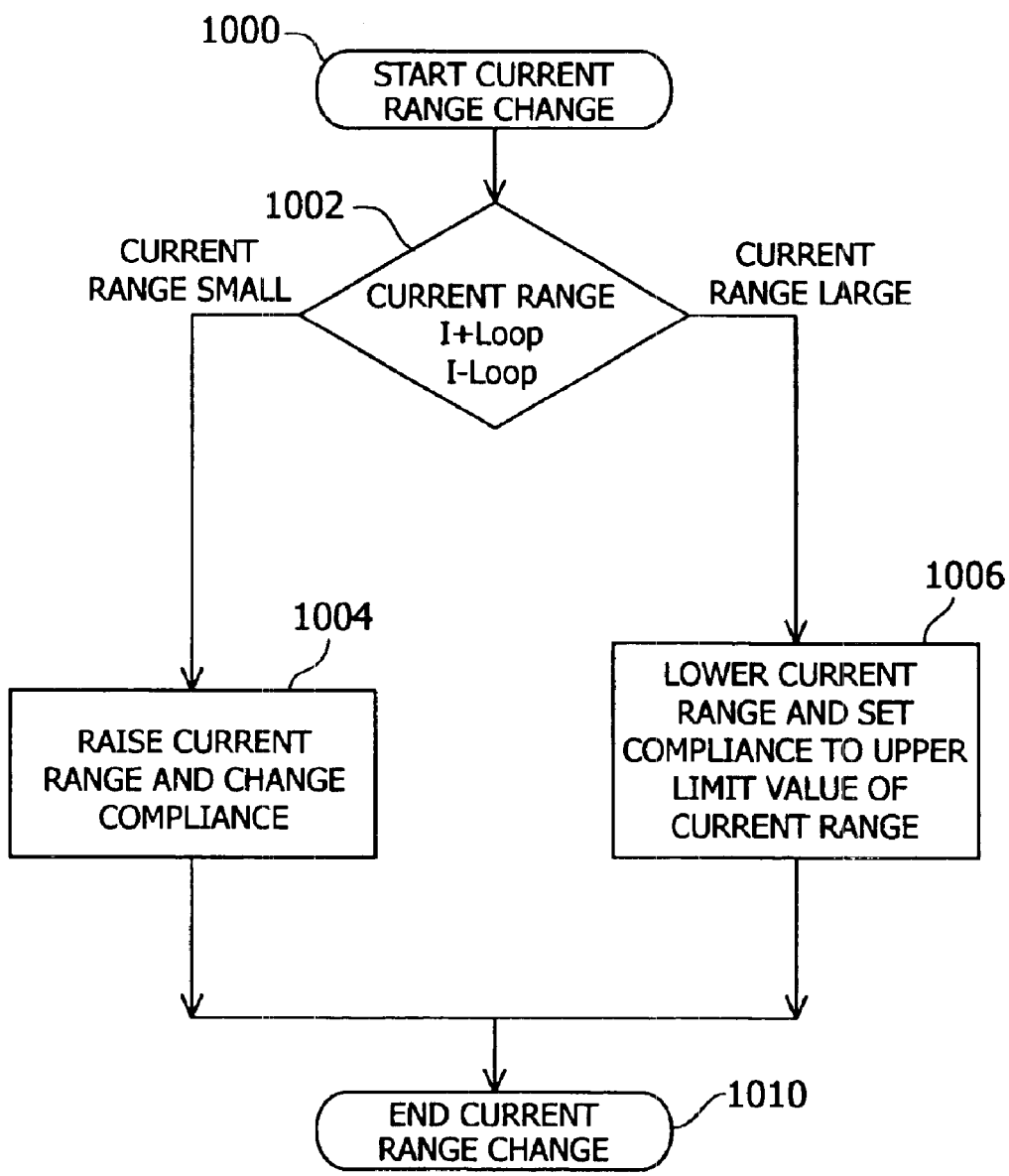
FIG. 10 is a flowchart showing the change of the current range in autoranging of the past.
Figure 12:
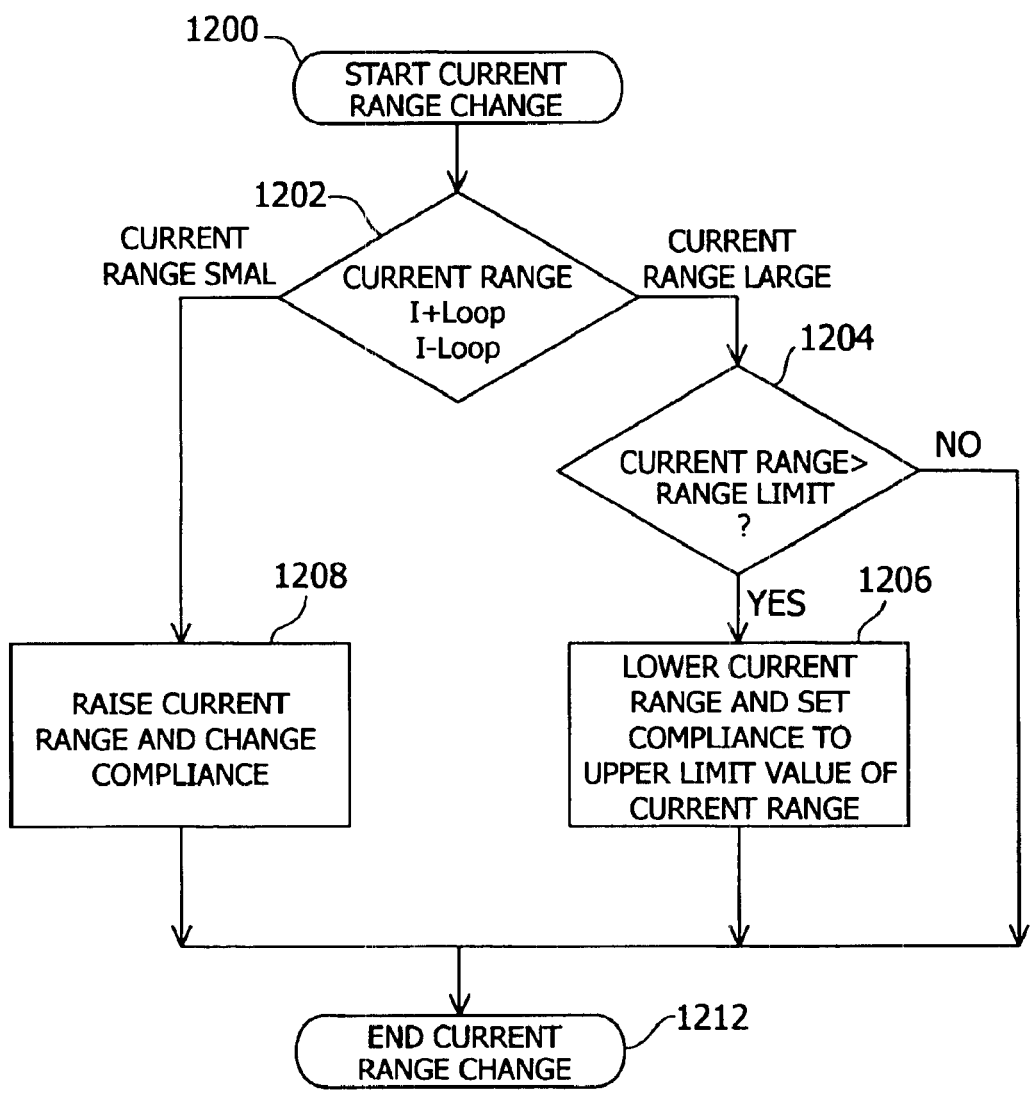
FIG. 12 is a flowchart showing the change of the current range in another example of autoranging in the past.
Figure 13:
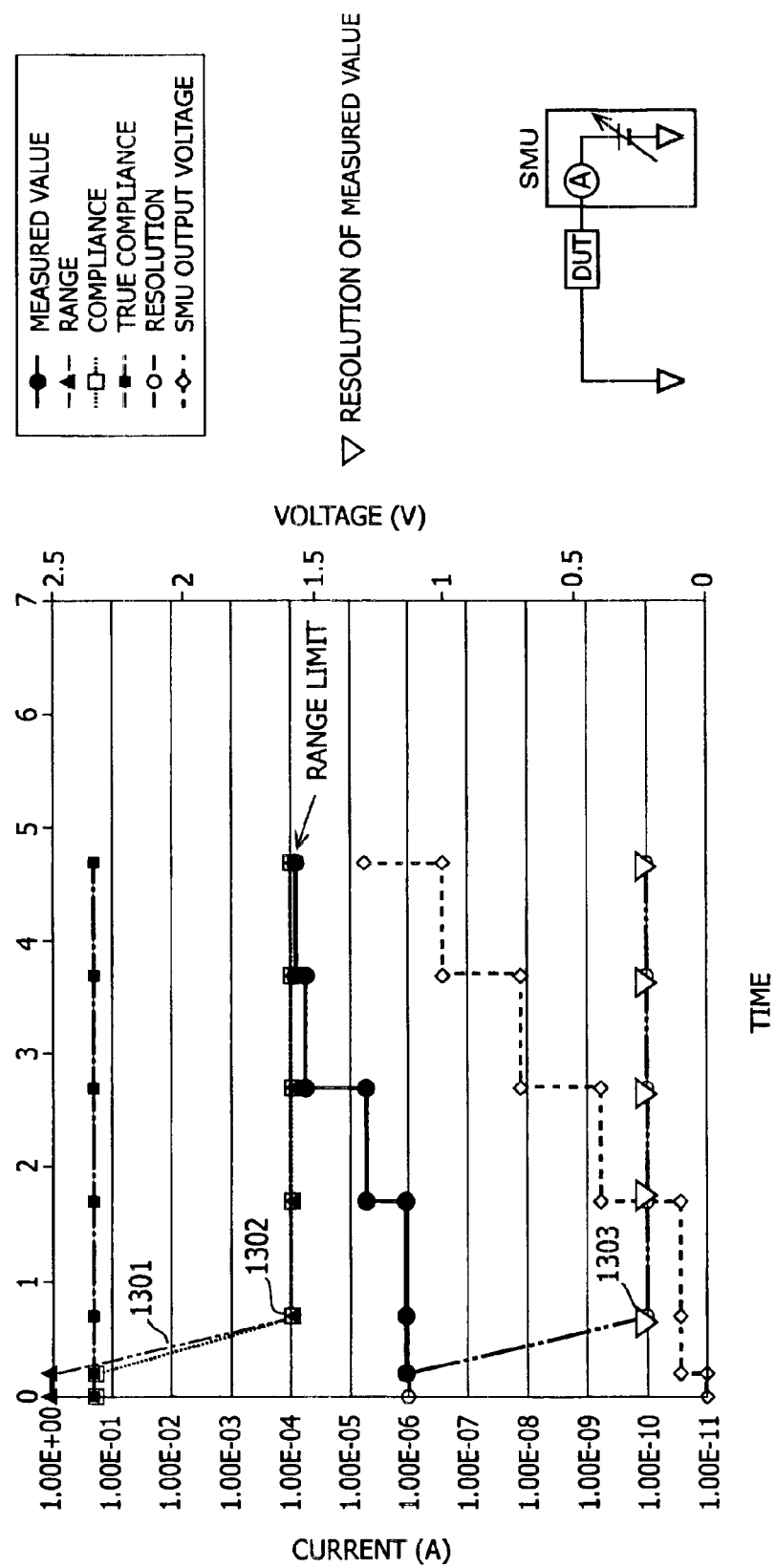
FIG. 13 is a graph showing the change of the current range with another example of autoranging in the past.
Figure 14:
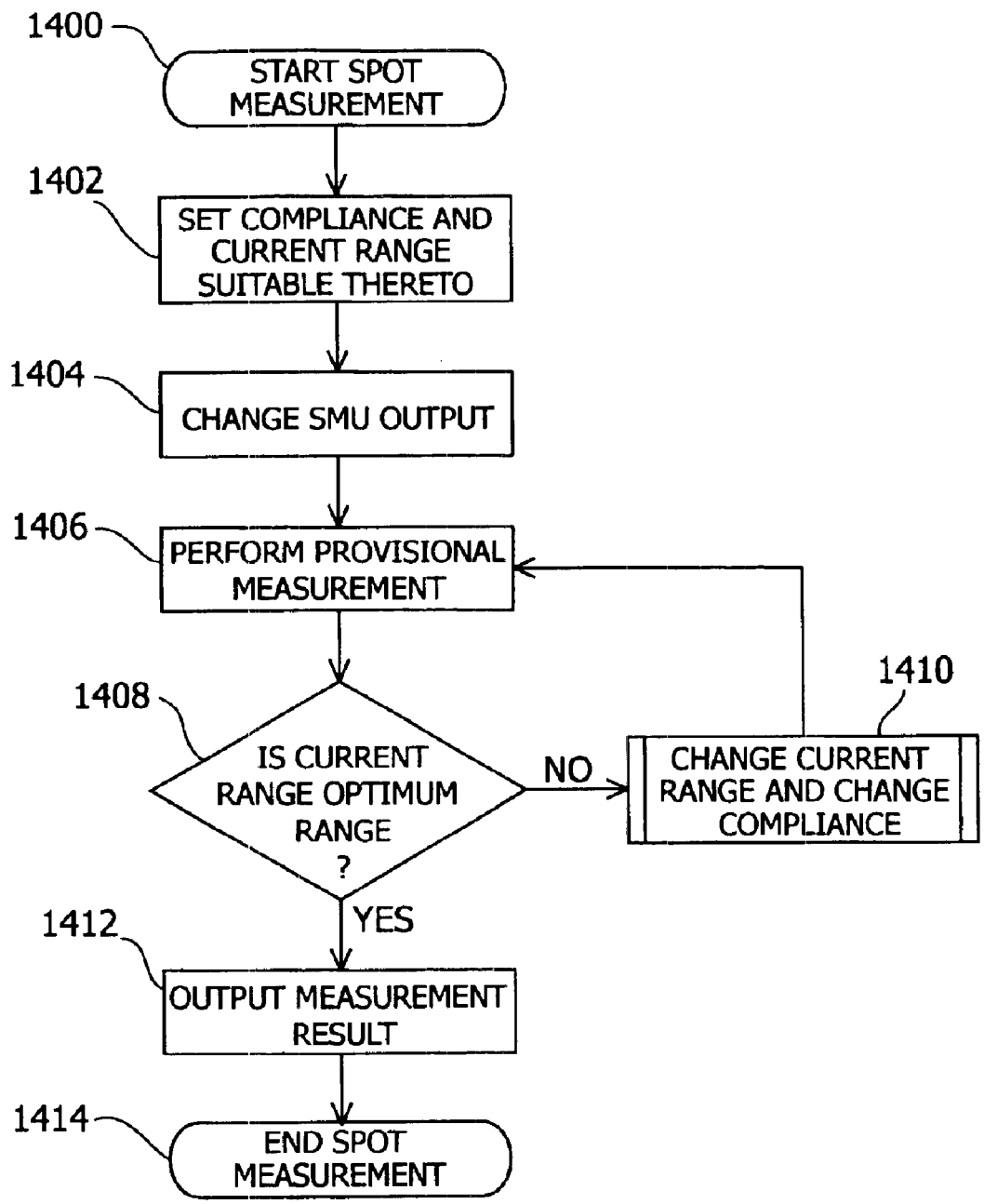
FIG. 14 is a flowchart showing the change of the current range in yet another example of autoranging in the past.

At step 108 if the current range is found not to be optimum; that is, if comparison of the current range with the measured current value shows that the current range is excessively high, so that it is not possible to carry out a measurement with sufficient accuracy, the process proceeds to step 116. The current range and compliance are changed by a prescribed amount of variation, and the compliance is changed to the upper limit value of the current range, after which the process is returned to step 106. In this case as well, in order to accommodate the next rise in the SMU output voltage after the output of the measurement result at step 110, the current range is raised by a prescribed amount at step 112, and the compliance is set to either the upper limit value of the changed current range or the true compliance, whichever is lower. Within step 116, a conventional algorithm such as the one shown in FIG. 10 or FIG. 12 may be used.

Figure 15:
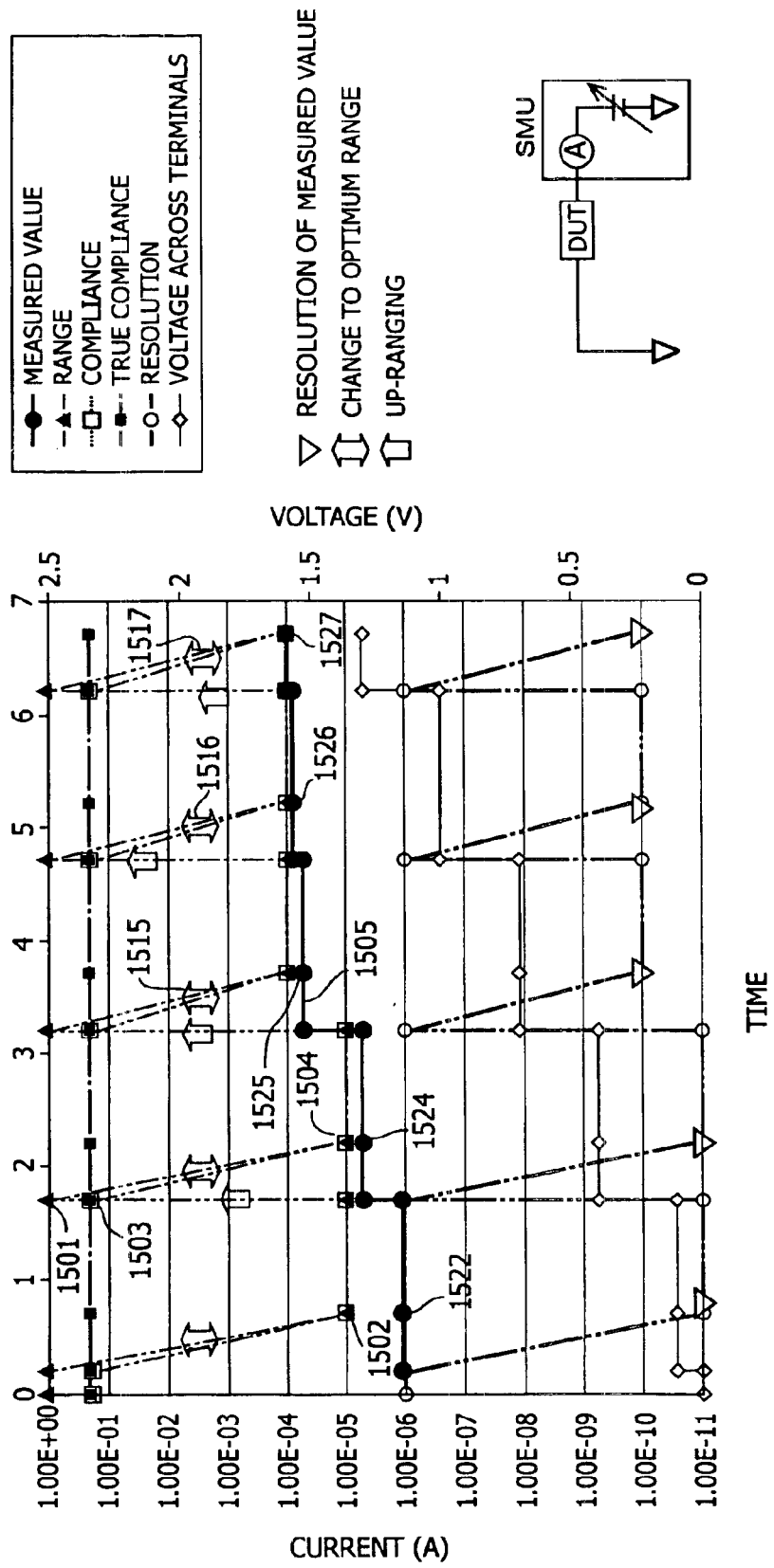
FIG. 15 is a graph showing the change of the current range in yet another example of autoranging in the past.

Referring to the flowchart of FIG. 4, the operation of the SMU according to FIG. 1 will be described. After the current is measured at the current range indicated by symbol ▲ at point 401 in FIG. 4, the current range is raised as indicated by symbol ▲ at point 402 in FIG. 4. When this is done, with regard to what range the current range is to be raised, it is possible to use a prescribed value established by the measurement apparatus or a prescribed value established by the user. By making the range change in this manner, even if the current value after the increase in the SMU output voltage indicated by symbol ● at point 404 is larger than the current range at the immediately previous measurement, as indicated by symbol □ at point 403, the current value is not limited to the compliance. For this reason, it is possible to reduce the possibility of the SMU outputting an expected voltage. Additionally, because it is possible to perform measurements at all measurement points in the optimum range, it is also possible to achieve the resolution indicated by 406. Because the measurement result is obtained each time using the optimum range, it is possible to measure the current value with high resolution, and further reduce the possibility that a variation occurs in the output voltage from the SMU. Compared to the conventional methods, because the length of time during which the range (range-up) is raised is longer, it is less likely that the current value is limited by the compliance due to noise or the like. Additionally, compared with the arrow 1516 in FIG. 15, showing certain conventional art, because the current range after up-ranging is lower than the range immediately after starting, for example, as in the measurement shown by symbol ● at point 409, the change in the current range may be as small as from 1.00E-02 A (10 mA) to 1.00E-04 A (100 μA). Because at arrow 1516 in the conventional art shown in FIG. 15, it is necessary to have a large variation from 1.00 A to 1.00E-04 A, with the present invention, the length of time required to change the current range may be reduced.

If the current value exceeds even the range value 402 indicated by ▲ after the up-ranging, however, even according to the above-described first embodiment it may not be possible to completely prevent a change in the SMU output voltage. Additionally, because in each of the spot measurements the probability of a range change to the optimum range is high, the measurement time may become overly long. Compared with the first embodiment, the second embodiment of the present invention provides a smaller probability of changing the range to the optimum range, and can therefore shorten the measurement time. Whereas in the first embodiment the range is raised every time a measurement result is output, according to the second embodiment according to the proportion of the measurement value relative to the current range is determined, and the range is raised only if this proportion exceeds a prescribed value.

Figure 2:
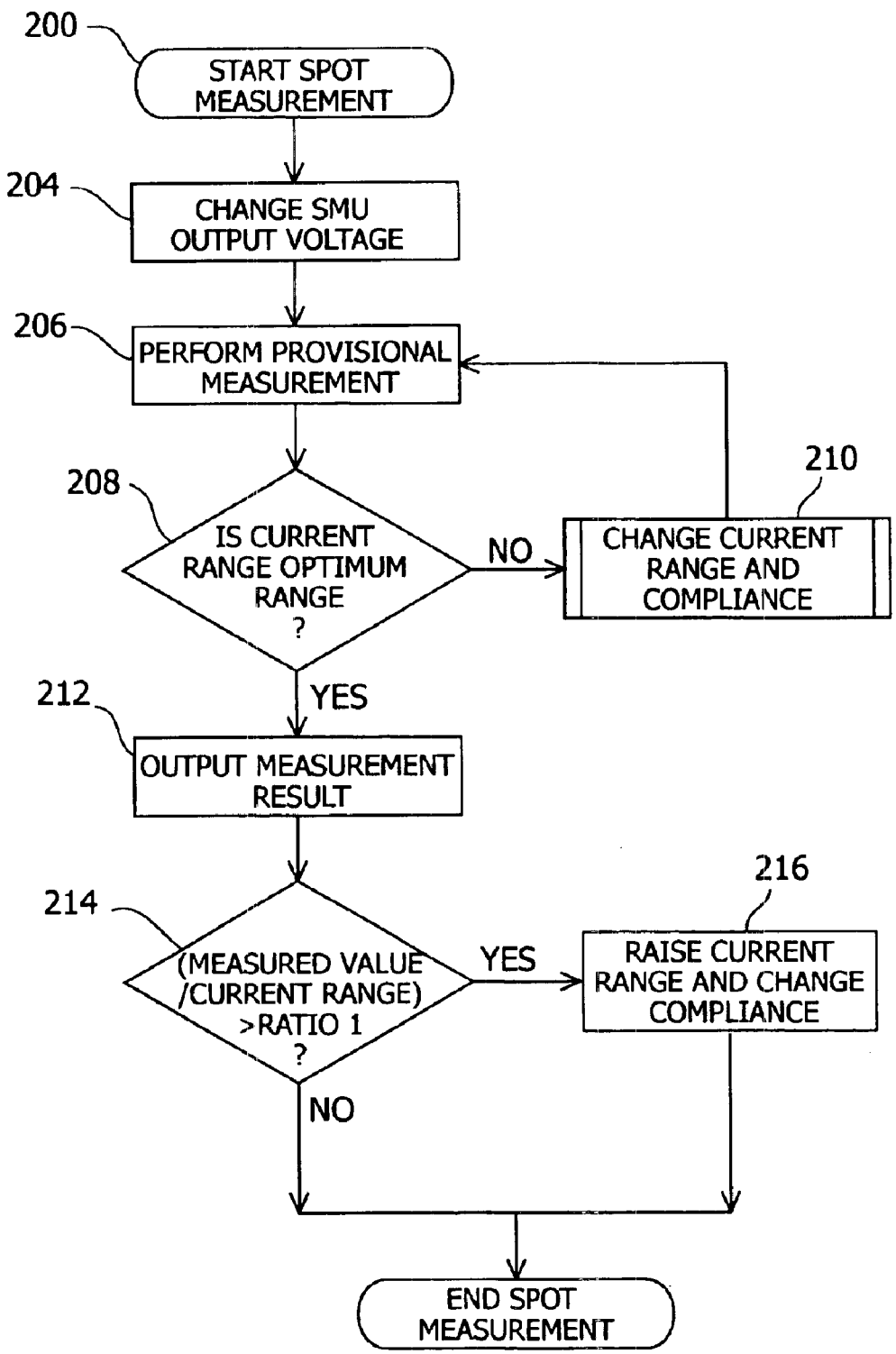
FIG. 2 is a flowchart showing the change of the current range according to a second embodiment of the present invention.

FIG. 2 shows the flowchart of the spot measurement that can be applied to step 804 shown in FIG. 8. Steps 200 to 210 are the same as steps 100 to 108 and 116 of the first embodiment. After outputting the measurement result at step 212, at step 214 if the proportion of the measured value relative to the current range is larger than a prescribed value (indicated as ratio 1 in FIG. 2), at step 216 the range is raised before the next provisional measurement, with the compliance changed accordingly. That is, the compliance is set to either the upper limit value of the changed current range or the true compliance, whichever is smaller. In this case, the above-noted prescribed value (ratio 1) can be set by either the measurement apparatus or the user. Thus, it is possible to set an appropriate value according to the measurement made beforehand, thereby enabling a shortening of the measurement time. At step 214, if the proportion of the measured value relative to the current range is less than the above-noted prescribed value (ratio 1), because the possibility of exceeding the compliance by the measured current in the next time is low, the current range is not changed.

Figure 5:
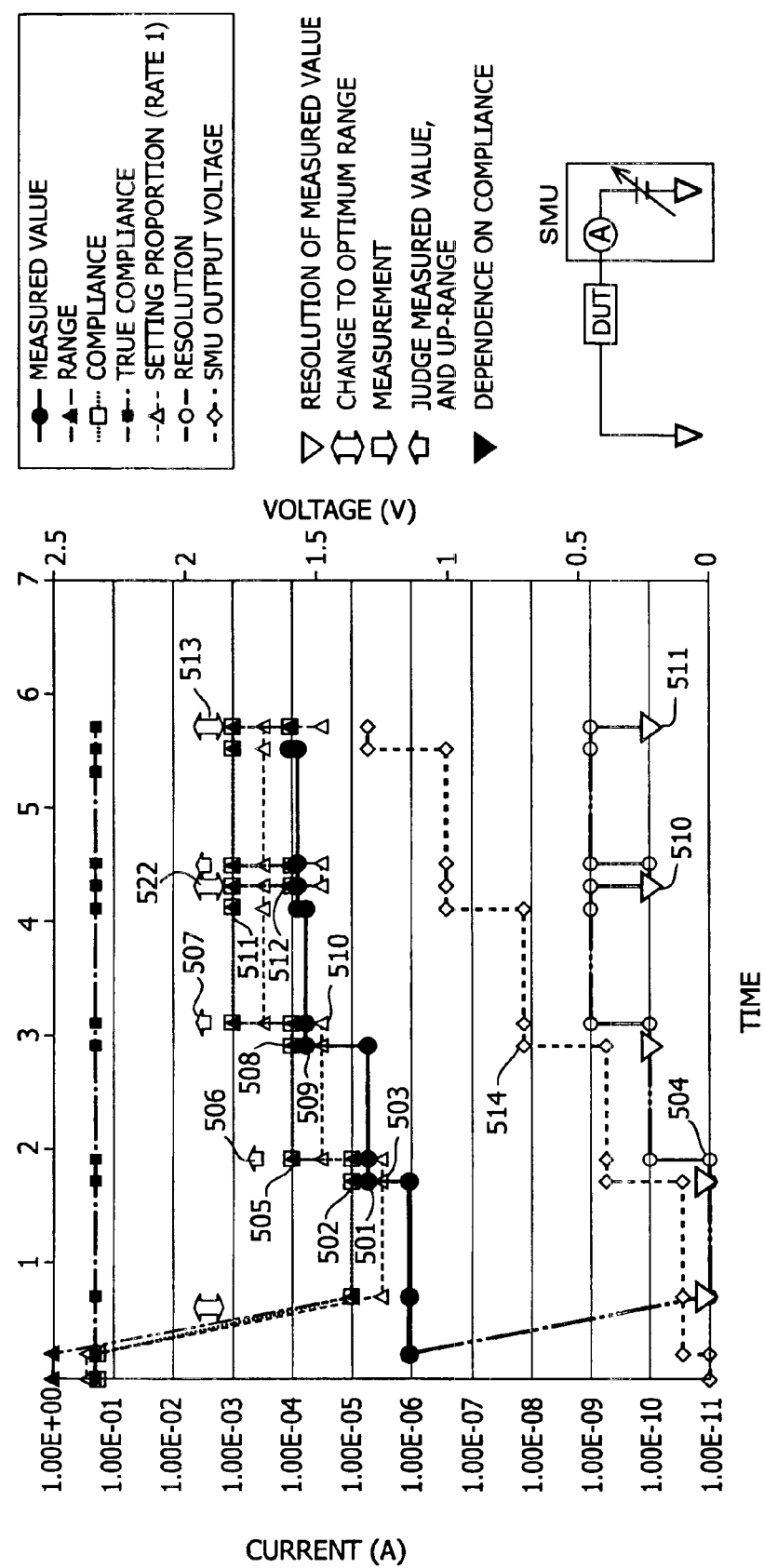
FIG. 5 is a graph showing the SMU operation in the second embodiment of the present invention.

The operation of the SMU in the second embodiment is described below, with reference made to the graph of FIG. 5. After the measurement is started at the point indicated by symbol ▲ at point 505 in FIG. 5, because the proportion of the measurement value 501 relative to the range at the point indicated by symbol ● is greater then the prescribed value 503 at Δ (ratio 1), the current range at arrow 506 is raised by one step only. By doing this, it is possible to reduce the probability that the next measured value 509 indicated by ● is limited to the compliance, and the SMU outputs a voltage indicated by ◇ at poin 514 that differs from an expected value. Additionally, because it is possible to perform measurements for all points with optimum ranges, it is possible to achieve the optimum resolution 504 indicated by ○ at all times.

Here the proportion of the measured value 509 indicated by ● relative to the optimum range 508 indicated by ▲ is large, but the amount of change of the current is small enough to enable the next measurement to be performed also with the same 1.00E-04 A current range 511 indicated by ▲ as in the previous measurement, at arrow 507 it could happen that the range, once increased to 1.00E-03 A, is then lowered at arrow 522. If the amount of change in the current is small in such cases as this one, because not only the number of times the range is changed at arrows 506 and 507 after a measurement, but also the number of changes made at arrow 522 and 513 to the optimum range increase, the number of range changes increases, the measurement time may become longer. In such cases, it is preferable to use the third embodiment of the present invention, which enables a reduction in the probability of an increase in the number of range changes.

Figure 3:
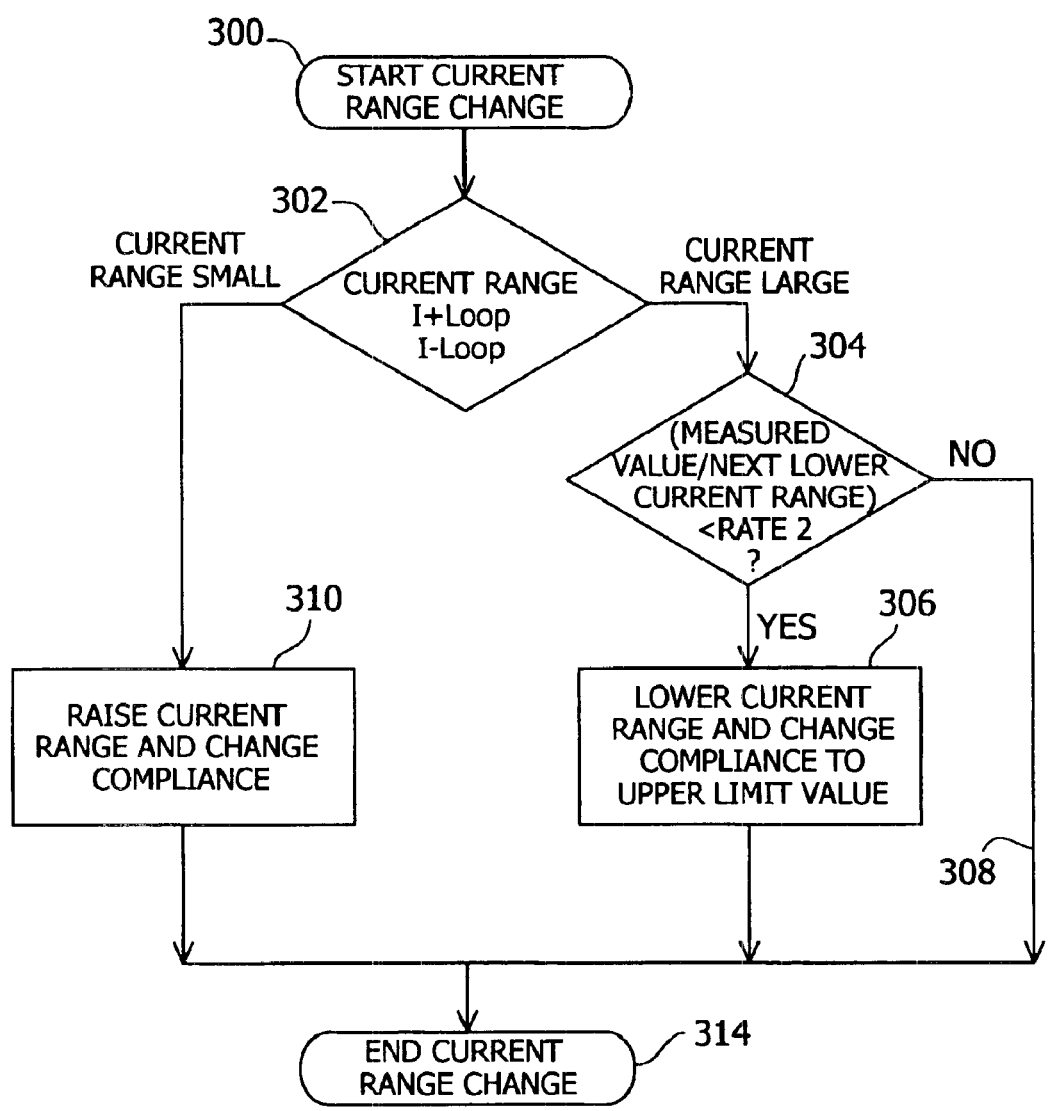
FIG. 3 is a flowchart showing the change of the current range according to a third embodiment of the present invention.

FIG. 3 shows the flowchart of the current range changing according to the third embodiment. Step 300 of FIG. 3 illustrates the part of the third embodiment corresponding to the range changing at step 210 in FIG. 2. At step 302, if the current range is found to be high and the range is lowered, another step is added to perform a judgment also as to the proportion of the measurement value relative to the next lower current range. At step 304, a judgment is made as to the proportion of the measured value relative to the next lower current range. If the proportion exceeds a prescribed value (indicated as ratio 2 in the drawing), rather than changing the current range and the compliance, the process proceeds to step 314 via path 308. For this reason, the frequency of range changing is reduced, so as to reduce the measurement time. The above-noted prescribed value (ratio 2) can be set by either the measurement apparatus or the user. At the above-noted step 304, if the proportion is less than the prescribed value (ratio 2), at step 306 the current range is lowered, the compliance is set to the upper limit value of the current range, and at step 314 the current range change is ended.

Figure 6:
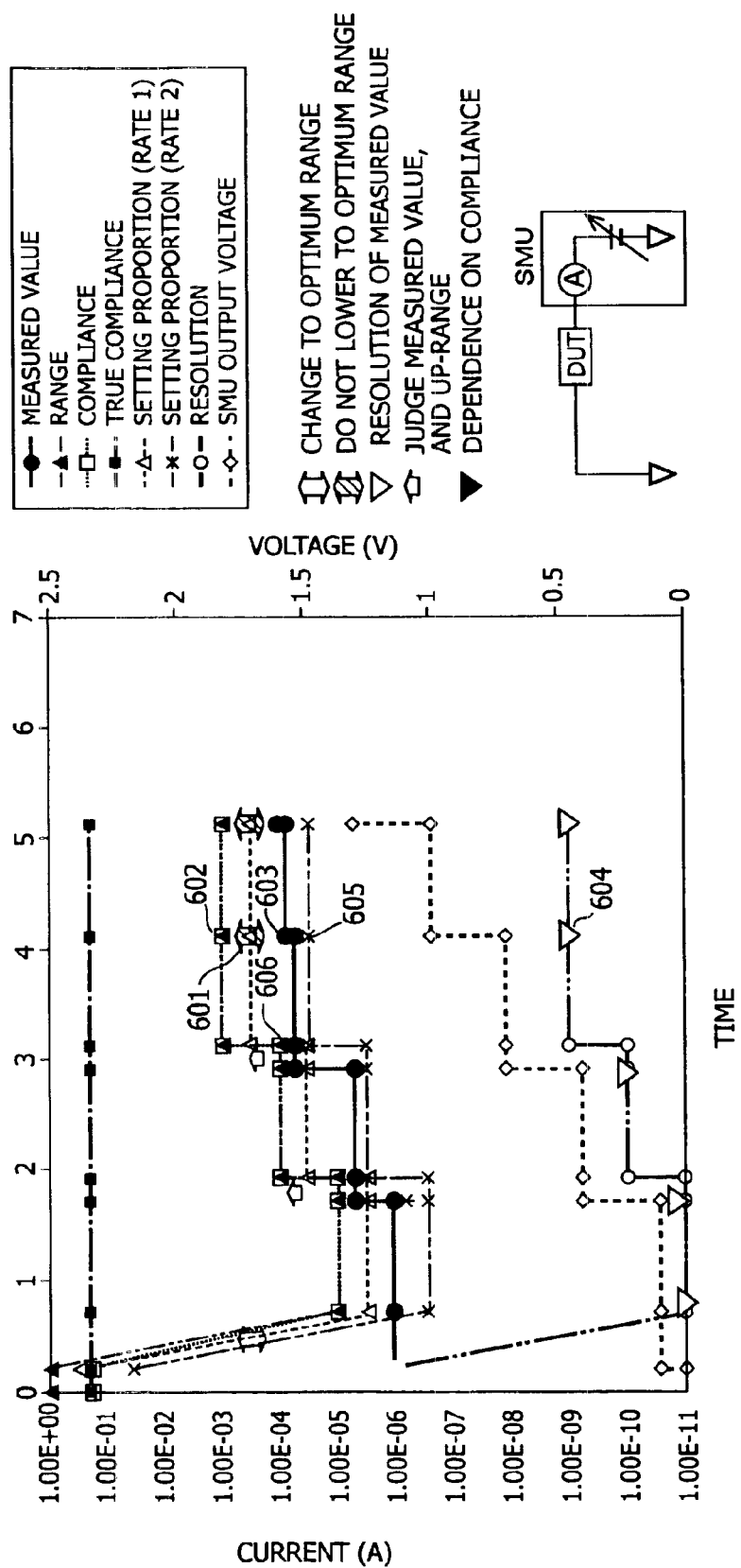
FIG. 6 is a graph showing the SMU operation in the third embodiment of the present invention.
Figure 7:
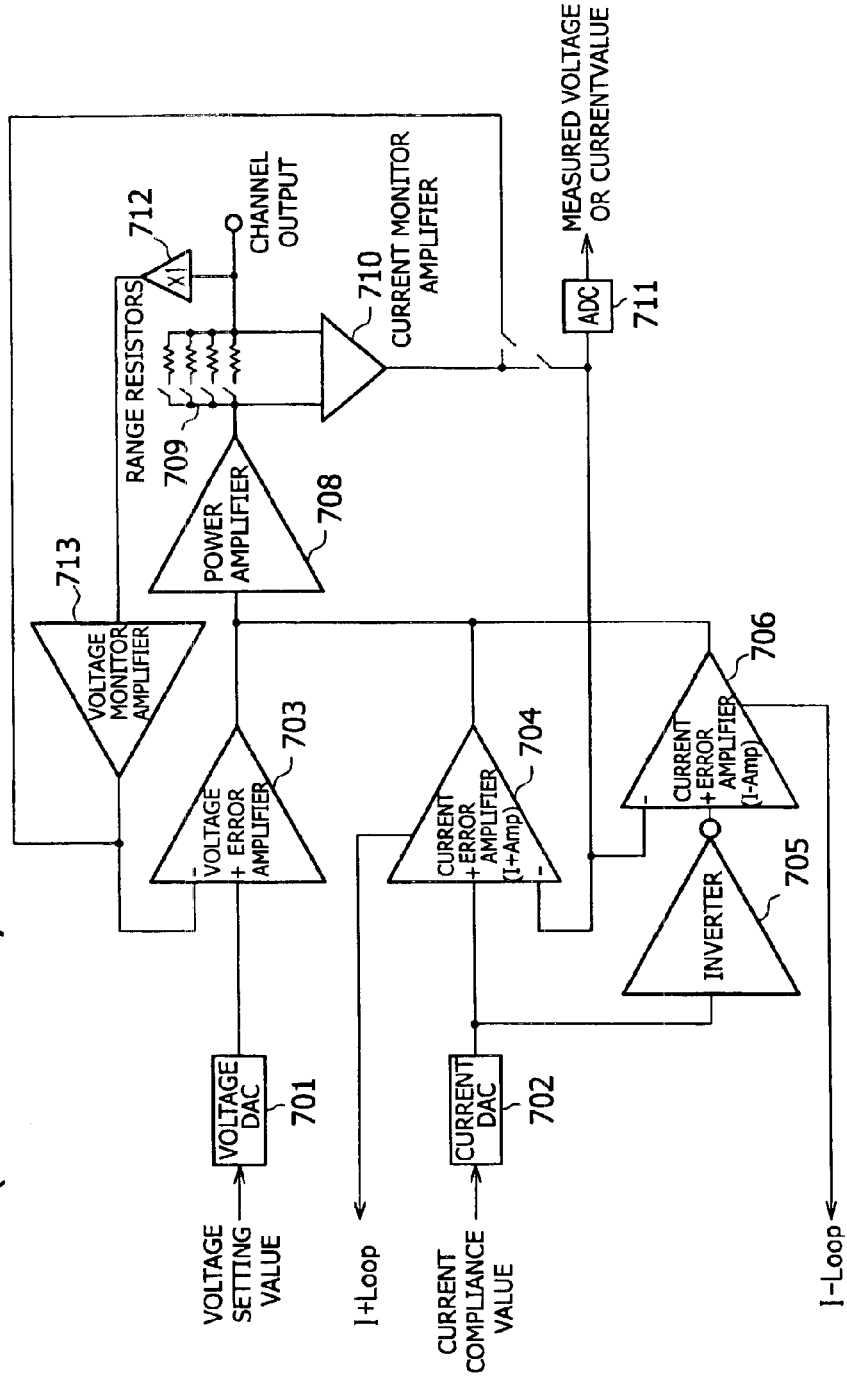
FIG. 7 is a block diagram showing an SMU of the past.

FIG. 6 shows a graph illustrating the operation of the SMU in the third embodiment. At the measurement at point 603 as indicated by ●, the optimum range with respect to the current value is at point 606 indicated by ▲, but because the measured value 603 as indicated by ● is larger than the prescribed proportion (ratio 2) 605 indicated by x, at point 602 with ▲ rather than perform a range change the measured value from the provisional measurement at step 206 is output as it is. Therefore, in addition to preventing a change in the current measurement range, which could lead to a change in the voltage, because the current range which has been raised at step 216 in the above-noted second embodiment has a reduced probability of being lowered at step 306, it is possible to perform measurements with a higher speed than with the second embodiment.

As described in detail above, a method according to the present invention enables high-accuracy, high-speed autoranging measurement, with only a small probability of the application of an unexpected voltage.

The entire disclosure of Japanese Patent Application 2003-3951, filed on Jan. 10, 2003, including the specification, claims, drawing, and summary thereof, is incorporated herein by reference in its entirety.

As the present invention can be embodied in several forms without departing from the spirit and essential characteristics thereof, the embodiments described herein are illustrative and not restrictive, the scope of the invention being defined by the appended claims rather than by the description preceding them. All changes falling within the bounds of the claims or the equivalence of the bounds thereof are therefore understood to be encompassed by the claims.

What is claimed is:

1. A method for measurement in which a resistance used for current detection is shared by a current measurement device and a voltage source having current limiting function, a value of current output from the voltage source is measured by the current measurement device using the resistance, and a compliance and a current range of the current measurement device are automatically changed in accordance with the measured current value, said method comprising the steps of:

setting the current range and a true compliance to user-specified values;

setting the compliance for the current output from the voltage source to a prescribed value;

measuring the value of current output from the voltage source using the current measurement apparatus;

comparing the measured current with the current range and determining whether or not the current range is optimum;

if the current range is found not to be optimum, changing the current range and performing another measurement of the current output from the voltage source with the newly changed current range, with the compliance being set at a value not exceeding the user-specified value and at an upper limit value in the newly changed current range; and if the current range is found optimum, having the current measurement device outputting the resulting current measurement value, then raising the current range and making a corresponding change in the compliance.

2. A method according to claim 1, wherein if the current range is found optimum, the compliance is changed to either the user-specified value or the upper limit value of the raised current range, whichever is lower.

3. A method according to claim 1, further comprising, after the step of performing another measurement, if the current range is found not to be optimum, raising the current range and changing the compliance accordingly.

4. A method according to claim 1, whereby the lower limit of the current range is set beforehand, with respect to the minimum output current value from the voltage source.

5. A method according to claim 1, wherein the step of determining whether or not the current range is optimum comprises the steps of:

calculating the ratio between the measured value of current output from the voltage source and the current range; and determining whether or not the current range needs to be changed by comparing the calculated ratio with a prescribed ratio.

6. A method according to claim 5, the step of determining whether or not the current range needs to be changed by comparing the calculated ratio with a prescribed ratio includes the calculation of the ratio between the measured value of current output from the voltage source and a current range that is lower than the presently set current range, and comparing this calculated ratio with a prescribed ratio.

7. A method according to claim 6, wherein the step of determining whether or not the current range needs to be changed sets the upper limit value of the maintained or changed current range as the true compliance.

8. A method according to claim 2, further comprising, after the step of performing another measurement, if the current range is found not to be optimum, raising the current range and changing the compliance accordingly.

9. A method according to claim 8, whereby the lower limit of the current range is set beforehand, with respect to the minimum output current value from the voltage source.

10. A method according to claim 9, wherein the step of determining whether or not the current range is optimum comprises the steps of:

calculating the ratio between the measured value of current output from the voltage source and the current range; and determining whether or not the current range needs to be changed by comparing the calculated ratio with a prescribed ratio.

11. A method according to claim 10, the step of determining whether or not the current range needs to be changed by comparing the calculated ratio with a prescribed ratio includes the calculation of the ratio between the measured value of current output from the voltage source and a current range that is lower than the presently set current range, and comparing this calculated ratio with a prescribed ratio.

12. A method according to claim 11, wherein the step of determining whether or not the current range needs to be changed sets the upper limit value of the maintained or changed current range as the true compliance.

* * * * *